July 27, 1965 E. P. PALMATIER 3,197,343

THERMOELECTRIC PANELS

Filed July 5, 1962

2 Sheets-Sheet 1

INVENTOR.
EVERETT P. PALMATIER.

BY Frank N. Decker Jr.

ATTORNEY.

July 27, 1965 E. P. PALMATIER 3,197,343

THERMOELECTRIC PANELS

Filed July 5, 1962 2 Sheets-Sheet 2

INVENTOR.
EVERETT P. PALMATIER

BY Frank N. Decker, Jr.

ATTORNEY.

1

3,197,343

THERMOELECTRIC PANELS

Everett P. Palmatier, Solvay, N.Y., assignor to Carrier Corporation, Syracuse, N.Y., a corporation of Delaware Filed July 5, 1962, Ser. No. 207,687

1 Claim. (Cl. 136—4)

This invention relates to a thermoelectric panel structure, more particularly to means permitting the construction of a thermoelectric panel so as to accommodate temperature changes, and at the same time insure secure electrical contact between the thermoelectric elements in the panel circuit.

Thermoelectric devices frequently utilize a plurality of pairs or couples of dissimilar thermoelectric elements grouped together in a circuit arranged between two plates to form a thermoelectric panel. One side of this panel is in heat exchange relationship with the cold junctions of the thermoelectric elements and is referred to as the cold side, while the other side of the panel is in heat exchange relationship with the hot junctions and is referred to as the hot side. Where the thermoelectric device is utilized for generating electricity, heat is applied to the hot side to effect the necessary temperature gradient between hot and cold junctions such as is required for the generation of electricity in accordance with the Seebeck effect. The panel is arranged for heating by a heating fluid or by radiation from the flame of a fuel burner.

Due to the difference in temperature between the hot and cold sides of the panel, differential thermal expansion of the various component parts of the panel produces warpage, notwithstanding attempts at heat equalization over the face area of the panel as it is heated to the operating temperature. This warping produces a variation in pressure on the thermoelectric elements with possible cracking of the brittle elements themselves, or impairment of their electrical connection in the circuit. It also causes failures of the hermetic enclosure of the thermoelectric elements. Optimum operating conditions are obtained by insuring a uniform electrical and mechanical connection between the circuit components and the thermoelectric elements so as to minimize contact resistance and so as to obtain maximum coefficient of performance from the panel.

It is accordingly a primary object of this invention to provide an improved thermoelectric panel structure.

A further object of the invention is to provide a construction for a thermoelectric panel so as to minimize warping.

Another object of the invention is to provide a thermoelectric panel construction adapted to accommodate stresses resulting from temperaure changes and differentials.

It is also an object of the invention to provide improved means for maintaining a uniform pressure on the thermoelectric elements of a thermoelectric panel.

These and other objects of the invention, which will become hereafter apparent, are attained in one embodiment thereof by forming the panel structure with a hot side plate made up of a multiplicity of individual pressure plates bonded to a relatively thin, flexible, sheet metal plate which has expansion joints in the form of flexible areas or corrugations surrounding each of the pressure plates. Thus the differential expansion of the hot side produces stresses which are individually taken up by the flexible plate. The pressure connection between the bridges and the thermoelectric elements on the hot side may be obtained by loading each pair of thermoelectric elements separately by means of a through-bolt and spring. The through-bolt extends through the pressure plate and hot side iron bridge and is welded to the

2 hot side plate. A Belleville spring is arranged about the nose of the bolt protruding through an aperture in the cold side plate and a suitable washer and nut secured and fused to form a hermetic seal.

An important feature of the invention resides in the use of pressure plates secured to a sheet metal plate which readily permits use of a thin sheet metal plate to hermetically seal the thermoelectric elements within the panel while preventing rupture of the plate due to differential thermal expansion. Another important feature of the invention is that the nut can readily be screwed onto the bolt and by controlling Belleville spring height a uniform pressure on the thermoelectric elements may be obtained.

The specific details of the invention, and their mode of functioning will become apparent from the following description in conjunction with the accompanying illustrative drawings, wherein.

Figure 1:
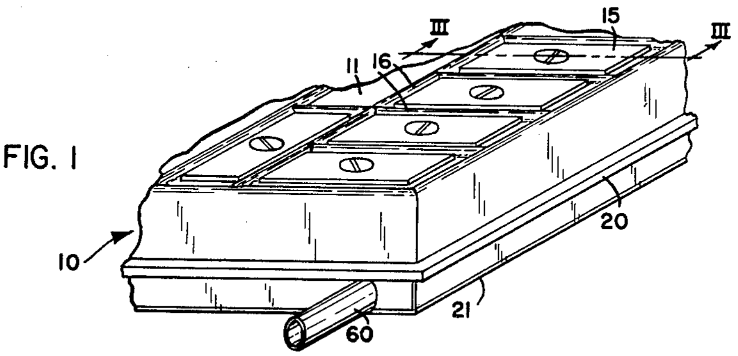
FIGURE 1 is a partial perspective view looking at the hot side of a section of a panel constructed in accordance with the teachings of this invention.
Figure 2:
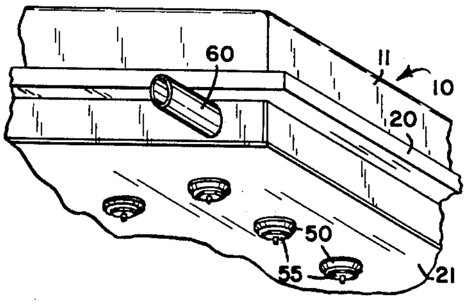
FIGURE 2 is a partial perspective view similar to FIGURE 1 of the obverse or cold side of the panel as seen in FIGURE 1.
Figure 3:
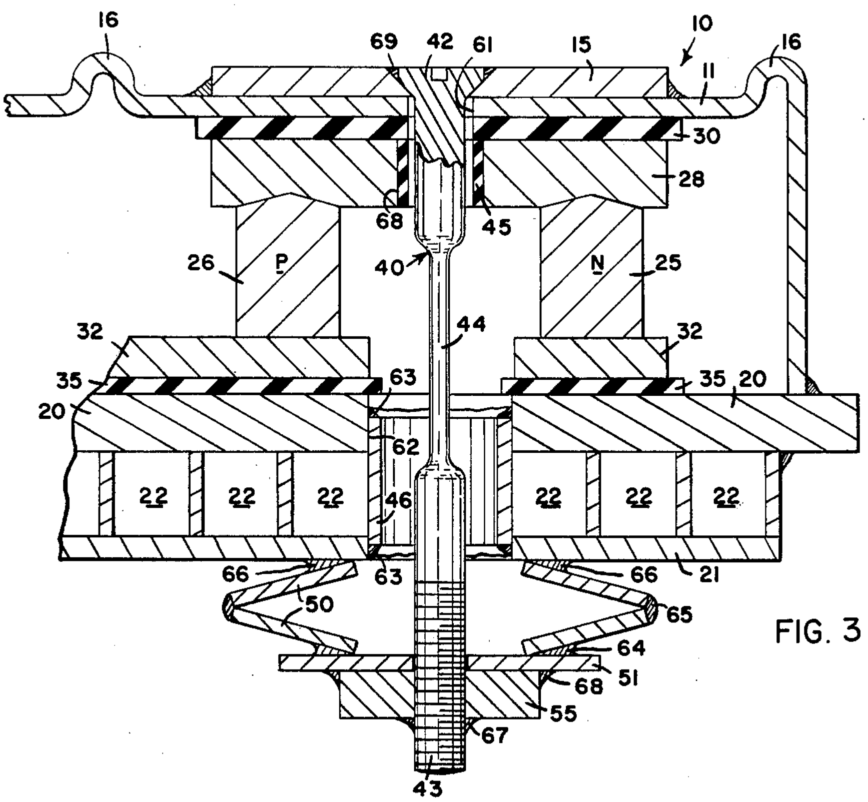
FIGURE 3 is a cross-sectional elevational view on line III—III of FIGURE 1.

Referring now more particularly to the drawings, like numerals in the various figures will be employed to designate like parts. As best seen in FIGURES 1–3, the novel panel structure 10 comprises an envelope hot side cover plate 11 formed of relatively flexible sheet material such as stainless steel or the like. A plurality of stainless steel pressure plates 15 are secured to the top surface of hot side plate 11 and spaced apart by means of expansion joint 16 surrounding each of the pressure plates 15. Joint means 16, or their equivalent, serve to permit lateral expansion in the plane of plate 11 to accommodate the relatively greater expansion of the hot plate 16 than that experienced on the cold side of the panel. Pressure plates 15 are firmly secured to sheet metal, hot side plate 11 by brazing, welding, or the like, preferably over the entire area of contact between the plate 15 and plate 11.

Plate 11 is shaped as best seen in FIGURES 1 and 2 in a substantially rectangular, pan-like configuration. The peripheral edge of the plate may be seam welded by a heliarc welding technique or the like to a relatively rigid, copper, cold side, bottom plate 20. Cold side plate 20 is formed with a housing 21 containing a plurality of cooling fluid passages 22 as best seen in FIGURE 3. Means 60 are provided for passing a cooling fluid, such as water, into passages 22 and suitable means (not shown) are provided to discharge the cooling fluid therefrom.

Within the enclosure provided by copper plate 20 and stainless steel cover 11 are arranged pairs of dissimilar thermoelectric elements 25, 26 making up the thermoelectric device, as best seen in FIGURE 3. A pair of negative and positive semiconductor thermoelectric elements, 25 and 26 respectively, is arranged adjacent and beneath the hot side cover plate 11 and each pressure plate 15. A bridge 28 of iron or the like is extended to electrically connect each pair of thermoelectric elements of the device to form junctions of a type adapted to be heated adjacent one end thereof. An electrically insulating, thermally conducting layer 30 of mica or the like is sandwiched between the bridge and hot side plate 11.

The cold junctions of the thermoelectric couples, adjacent cold side plate 20, are formed and electrically connected by cold bridges 32 of copper or the like. As will be understood by those skilled in the art, the bridge 32, shown on the right in FIGURE 3, extends to an adjacent thermoelectric element so as to permit connection of the pairs of thermoelectric elements making up the panel into an electrical circuit. An electrical insulating, thermally conducting layer 35 of mica or the like is interposed between the cold bridge 32 and cold side plate 20, as best seen in FIGURE 3.

The components are maintained in assembled relationship by means of bolts 40 having a head 42, a threaded nose portion 43 and a reduced diameter shank portion 44. Bolt 40 is positioned in a bolt hole 61 drilled through the hot side cover plate 11 of panel 10, and permitting the nose 43 of bolt 40 to be extended through a hole 62 formed in the cold side plate 20 of panel 10. A tubular insulating bushing 45 preferably is secured in the bolt hole portion 68 extending through hot side bridge 28; and a cold side bushing 46 of copper or the like is secured to cold side plate 20 and the water passage housing 21 by brazes or welds 63.

Bolt 40 is extended through the bolt hole in pressure plate 15 and the bushings 45 and 46 as viewed in FIGURE 3. Head 42 of bolt 40 is welded by means of heliarc welding or the like to the pressure plate 15, and a truncated double cone-shaped spring 50, such as a single or a double Belleville spring, having a washer 51 brazed or welded thereto at 64 is arranged over nose 43 of bolt 40. Alternately, a single or integral double Belleville spring washer may be used with or without washer 51. A tight joint may be formed by soldering the juncture of a pair of frustro-conical Belleville spring washers at 65 to form a conical spring 50 and by soldering the assembly at 66 to water passage housing 21. Nut 55 is threaded on nose portion 43 and may be soldered thereto at 67 and 68, if desired, to maintain the components in assembled, hermetically tight, relationship. Alternately, the desired components may be assembled with nut 55 tightened to provide the desired tension and the various components may be fused together by soldering in a single operation.

Figure 4:
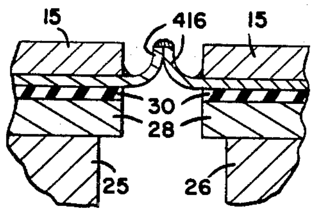
FIGURE 4 illustrates another mode of forming the expansion joints of the hot side plate.

In the embodiment of the invention illustrated in FIGURE 4, pressure plate 15 and thermoelectric elements 25 and 26 remain the same as do the other components of the panel. Whereas corrugation 16 of the embodiment of the invention illustrated in FIGURES 1–3 is preferably formed by die stamping techniques, the flexible plate 411 of the embodiment of FIGURE 4 of the invention is formed of a plurality of die formed cups each having a lip 416, formed at an angle to the plane of flexible plate 411, around its peripheral edge. The cups making up plate 411 are each of a dimension sufficient to accommodate pressure plate 15. A plurality of these cups is then fused by welding or the like to form a plate of desired dimensions such as is required in the panel, the joined lips 416, forming the expansion joint. The cusps of adjacent cups may be arranged either facing outwardly of the panel, as shown, or inwardly thereof, if desired .

Figure 5:
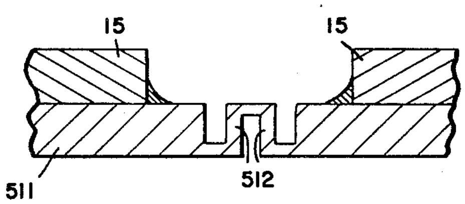
FIGURE 5 illustrates an additional mode of forming the expansion joints of the hot side plate.

In the FIGURE 5 embodiment of the invention, a hot side plate 511 is shown in which flexibility is provided by milling slots to form lips 512 extending at an angle to the plane of plate 511, in an arrangement such is indicated in the drawing, around the area against which the pressure plates 15 will lie.

Figure 6:
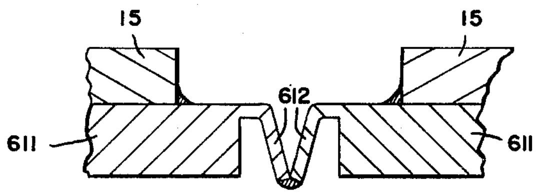
FIGURE 6 illustrates an alternative embodiment of the expansion joint of the hot side plate.

In the FIGURE 6 embodiment of the invention the cover plates 611 are machine formed with flanges 612 bent downwardly and fused at their point of contact so as to provide a desired expansion joint between adjacent plates. It will be understood that the expansion joint formed between the flanges extends about the bonds of pressure plates 15 so as to provide the necessary flexibility for warpage accommodation.

In use, the aforedisclosed structural components are arranged in assembled relationship to form the novel panel 10 as described. It will be understood that the panel structure may be employed either as a thermoelectric generator, or as a heat pump. The instant construction is designed with primary reference to the problems of electrical generation, where the temperatures are such as to produce warping. By the novel panel formation, warpage effects are substantially eliminated, while at the same time insuring an adequacy of electrical connection between the components so as to obtain efficiency of operation.

The flexible hot side plate 11, with its expansion joints 16 serves to take up any distortions resulting from temperature changes and heat variations over the surface of plate 11. At the same time, pressure plates 15 acted on by bolts 40 serve to maintain adequate pressure over each individual pair of thermoelectric elements 25 and 26 so as to insure desired contact between the bridges and the thermoelectric elements, it being understood that the hot side bridge 28 is usually coupled to the thermoelectric elements only by a pressure bond. The hermetic seal between the hot side and cold side plates 11 and 20 is maintained by the heliarc weld 69 about the head of bolt 40. The cold side is maintained hermetically sealed by the Belleville springs fused to cold side water passage housing and to the tubes 46 joined to cold side plate 20.

It is thus seen that a simple panel structure having a flexible cold plate has been provided in which a satisfactory pressure bond is maintained between the thermoelectric elements and the bridges on the hot side of the panel to insure desired electrical contact under conditions of differential thermal expansion between hot plate 11 and cold plate 20. This invention also provides means for uniformly controlling the compressive force on each individual pair of associated thermoelectric elements by adjusting the degree of tightening of bolts 55 to provide a uniform deflection of washer 50. By means of the described invention enclosure wall breakage of the thermoelectric panel due to thermal expansion stresses is prevented and each pair of thermoelectric elements is enabled to act as an individual couple without being effected by adjacent couples.

The above disclosure has been given by way of illustration and elucidation, and not by way of limitation, and it is desired to protect all embodiments of the herein disclosed inventive concept within the scope of the appended claim.

I claim:

A thermoelectric panel assembly comprising:

(1) a substantially flat hot plate adapted to be heated, and a substantially flat cold plate, adapted to be cooled; said hot and cold plates being spaced from each other and having an electrically insulating, thermally conducting layer on the inner surface of said plates; said plates forming walls of a sealed enclosure;

(2) a plurality of dissimilar thermoelectric elements disposed between said hot plate and said cold plate, said thermoelectric elements being electrically connected by conducting bridges to form thermoelectric junctions of a type adapted to be heated adjacent said hot plate, and thermoelectric junctions of a type adapted to be cooled adjacent said cold plate, said thermoelectric junctions of the type adapted to be heated lying in substantially a single plane and being connected by said bridges by a pressure contact connection;

(3) a plurality of substantially flat rigid pressure plates overlying said hot plate adjacent a corresponding plurality of individual bridges forming said junctions of the type adapted to be heated, each of said plurality of rigid pressure plates lying substantially in a single plane; said rigid pressure plates being joined about their entire periphery with adjacent pressure plates by a flexible fluid tight joint;

(4) a cold side housing plate spaced from said cold plate and forming therewith a plurality of cooling water passages;

(5) a fastening member secured to each said pressure plate, said fastening member extending from its associated pressure plates through an aperture formed in the associated bridge overlaid by said pressure plate, each said fastening member also extending between the pair of thermoelectric elements joined by said associated bridge and extending through an aperture in said cold plate and through an aperture formed in said cold side housing plate to the opposite side thereof from that most closely adjacent the pair of thermoelectric elements; and (6) an at least partially frusto-conical spring washer member through which said fastening member extends, said spring washer member being secured to said opposite side of said cold side housing plate and to said fastening member to tension said fastening member to maintain the pressure contact connections between the pair of thermoelectric elements and their associated bridge.

References Cited by the Examiner

UNITED STATES PATENTS 3,111,432 11/63 Sickert et al. ____________ 136—4

FOREIGN PATENTS 874,660 8/61 Great Britain.

WINSTON A. DOUGLAS, *Primary Examiner.*

JOHN H. MACK, *Examiner.*